(12) United States Patent
Miks et al.

(10) Patent No.: US 7,112,875 B1
(45) Date of Patent: Sep. 26, 2006

(54) SECURE DIGITAL MEMORY CARD USING LAND GRID ARRAY STRUCTURE

(75) Inventors: Jeffrey Alan Miks, Chandler, AZ (US); Ludovico E. Bancod, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 11/060,264

(22) Filed: Feb. 17, 2005

(51) Int. Cl.
*H01L 23/02* (2006.01)

(52) U.S. Cl. .................. 257/679; 257/784; 257/787; 257/E23.064

(58) Field of Classification Search ............... 257/679
See application file for complete search history.

(56) References Cited

U.S. PATENT DOCUMENTS

| | | |
|---|---|---|
| 3,668,299 A | 6/1972 | McNeal |
| 4,532,419 A | 7/1985 | Takeda |
| 4,905,124 A | 2/1990 | Banjo et al. |
| 4,974,120 A | 11/1990 | Kodai et al. |
| 5,172,214 A | 12/1992 | Casto |
| 5,360,992 A | 11/1994 | Lowrey et al. |
| 5,574,309 A | 11/1996 | Papaietro et al. |
| 5,742,479 A | 4/1998 | Asakura |
| 5,753,532 A | 5/1998 | Sim |
| 5,784,259 A | 7/1998 | Asakura |
| 5,789,280 A | 8/1998 | Yokota |
| 5,808,359 A | 9/1998 | Muto et al. |
| 5,822,190 A | 10/1998 | Iwasaki |
| 5,893,724 A | 4/1999 | Chakravorty et al. |
| 5,977,613 A | 11/1999 | Takata et al. |
| 6,040,622 A | 3/2000 | Wallace |
| 6,143,981 A | 11/2000 | Glenn |
| D445,096 S | 7/2001 | Wallace |
| D446,525 S | 8/2001 | Okamoto et al. |
| 6,376,283 B1 | 4/2002 | Chen |
| 6,384,472 B1 | 5/2002 | Huang |
| 6,462,273 B1 * | 10/2002 | Corisis et al. ............. 174/52.2 |
| 6,476,331 B1 * | 11/2002 | Kim et al. .................. 174/261 |
| 6,476,469 B1 | 11/2002 | Hung et al. |
| 6,483,038 B1 * | 11/2002 | Lee et al. ................... 174/255 |
| 6,545,332 B1 | 4/2003 | Huang |

(Continued)

FOREIGN PATENT DOCUMENTS

JP 3112688 5/1991

(Continued)

*Primary Examiner*—Minhloan Tran
*Assistant Examiner*—Leslie Pilar Cruz
(74) *Attorney, Agent, or Firm*—Stetina Brunda Garred & Brucker

(57) ABSTRACT

A memory card comprising a substrate which has a plurality of contacts, at least one die pad, and a plurality of traces. The contacts, the die pad and the traces are disposed in spaced relation to each other and each define opposed first and second surfaces. Mounted to the first surface of the die pad is at least one electronic component which is electrically connected to at least one of the contacts either directly or via one or more of the traces. A first encapsulation part covers the second surfaces of the die pad and the traces, with the second surfaces of the contacts being exposed in the first encapsulation part. A second encapsulation part covers the electronic component and the first surfaces of the die pad, the contacts, and the traces. The first and second encapsulation parts collectively define a body of the memory card which includes a bottom surface having the second surfaces of the contacts exposed therein.

20 Claims, 8 Drawing Sheets

U.S. PATENT DOCUMENTS

| | | |
|---|---|---|
| 6,603,196 B1 | 8/2003 | Lee et al. |
| 6,624,005 B1 | 9/2003 | Di Caprio et al. |
| 2004/0245674 A1 * | 12/2004 | Yew et al. ............. 264/272.17 |

FOREIGN PATENT DOCUMENTS

| | | |
|---|---|---|
| JP | 7017175 | 1/1995 |
| JP | 8190615 | 7/1996 |
| JP | 10334205 | 12/1998 |
| JP | 4253674 | 9/2004 |
| KR | 199410938 | 5/1994 |
| KR | 199552621 | 12/1995 |

* cited by examiner

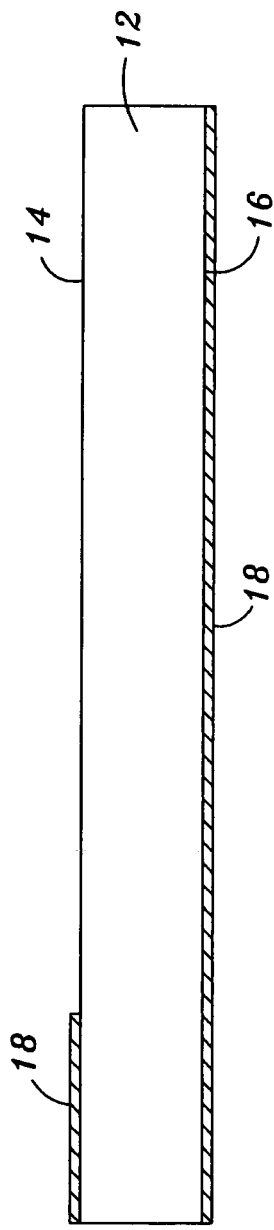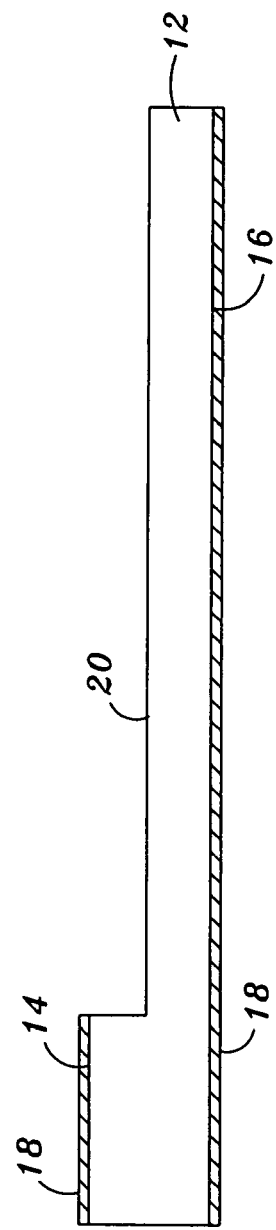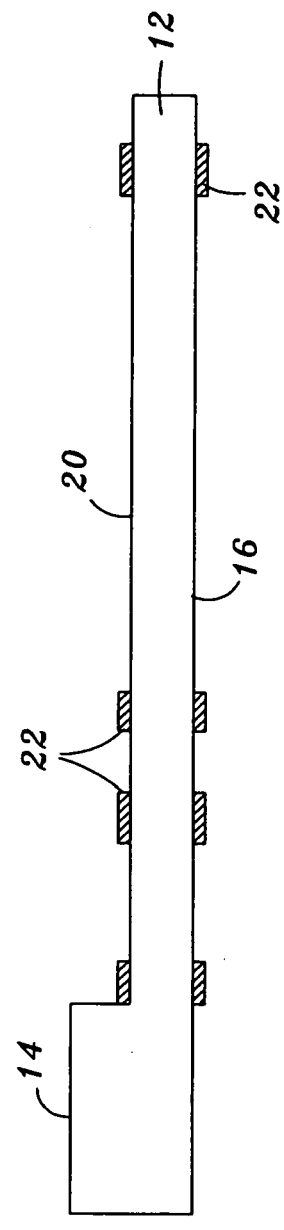

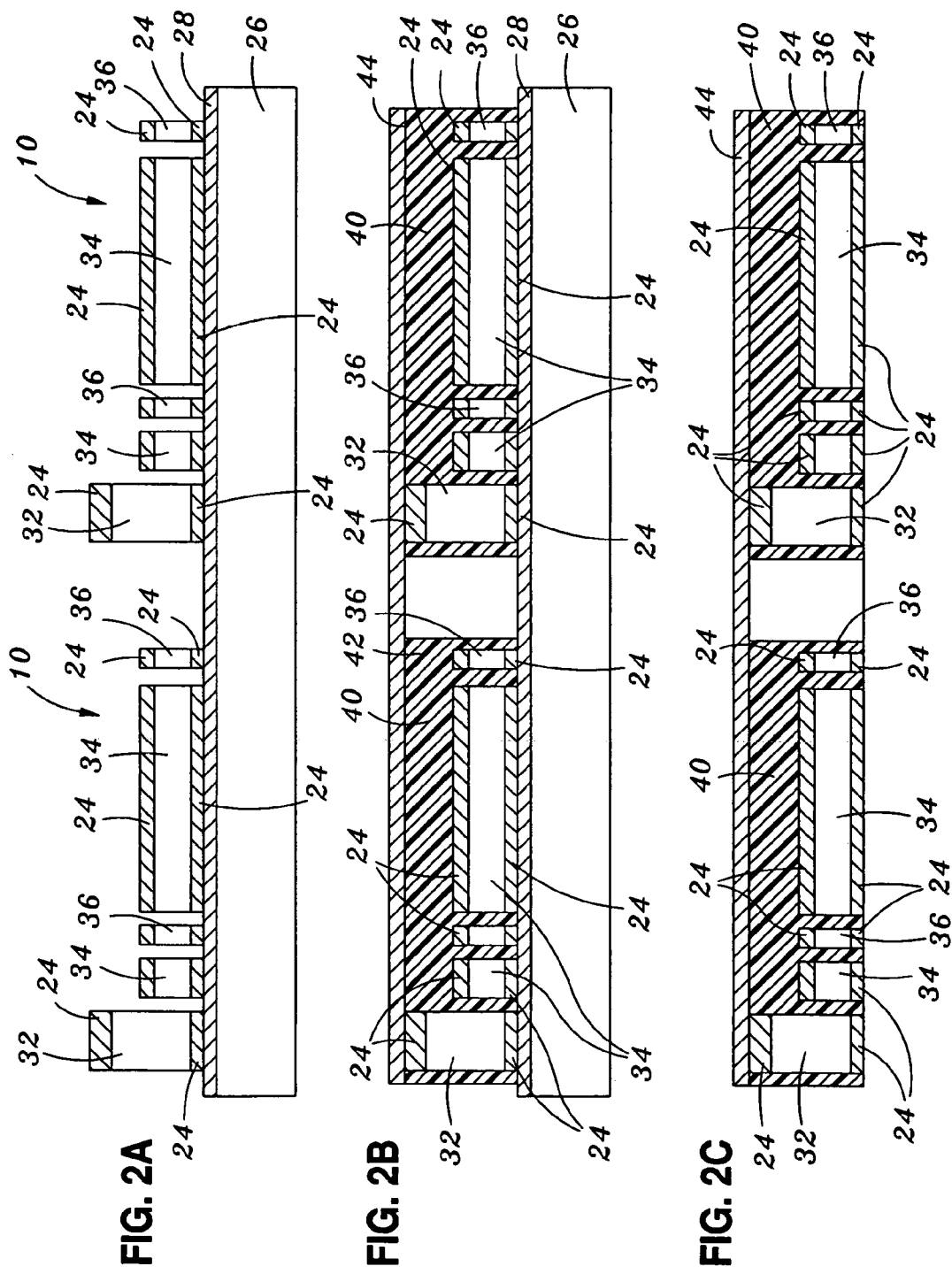

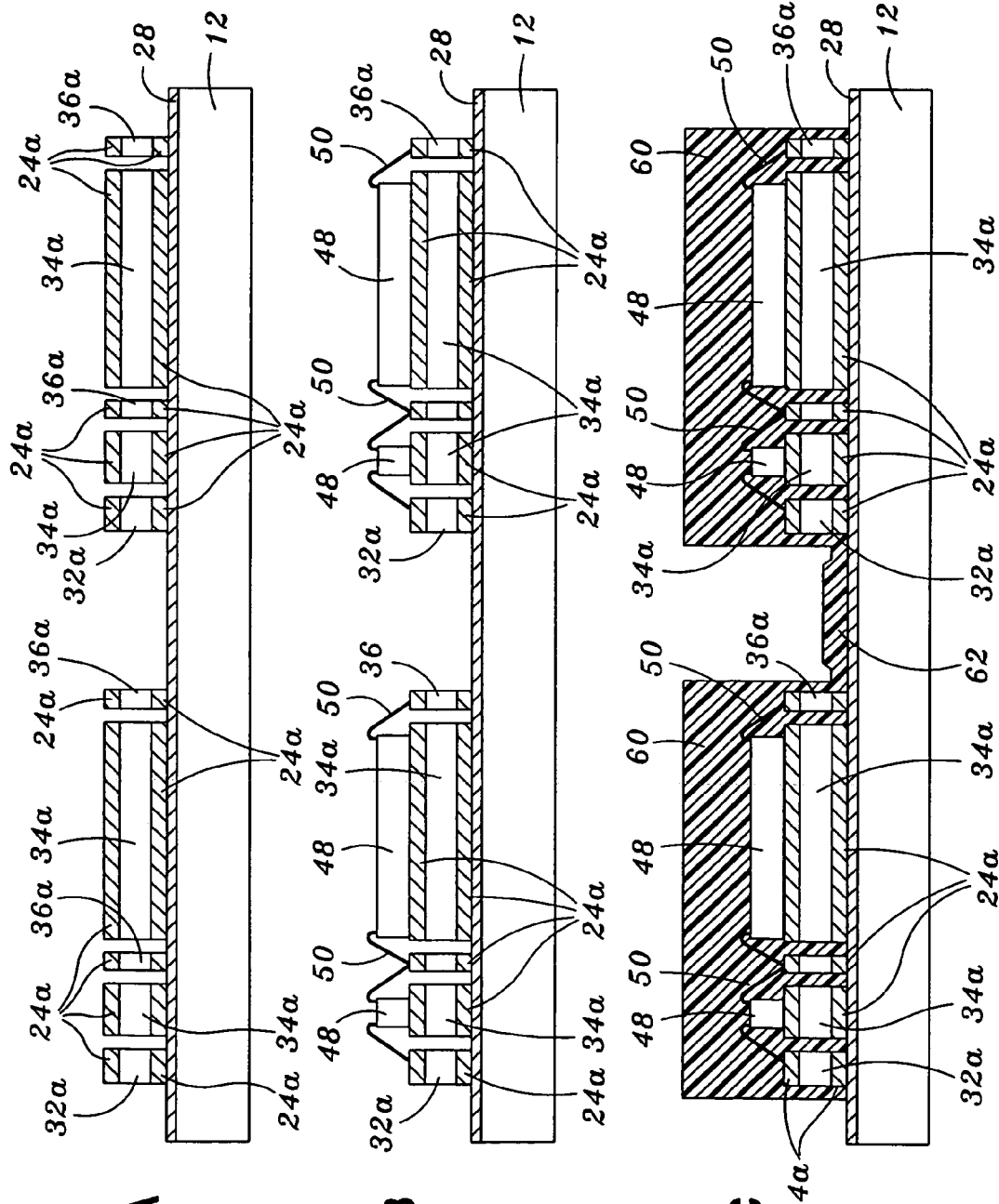

SECURE DIGITAL MEMORY CARD USING LAND GRID ARRAY STRUCTURE

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

The present invention relates generally to memory cards, and more particularly, to a memory card (e.g., a secure digital card (SDC)) which includes a land grid array (LGA) structure and is fabricated through the implementation of a two-stage molding process such that the external signal contacts (ESC's) are located on a recessed plane within the memory card, and the exposed tie bars which are typical artifacts of traditional leadframe based memory cards are eliminated without compromising routability between the components.

As is well known in the electronics industry, memory cards are being used in increasing numbers to provide memory storage and other electronic functions for devices such as digital cameras, MP3 players, cellular phones, and Personal Digital Assistants. In this regard, memory cards are provided in various formats, including multi-media cards and secure digital cards.

Typically, memory cards include multiple electronic components such as integrated circuit devices, semiconductor dies, passive components, and the like. The components are often interconnected using a circuit board substrate which can accommodate complex routing. Memory cards also include electrical contacts or terminals for providing an external interface to an insertion point or socket. These electrical contacts are typically disposed on one side or face of the circuit board substrate, with the electrical connection to the components mounted to the substrate being provided by conductive vias and traces which extend through and along the substrate.

In certain memory cards, a leadframe assembly is used as an alternative to the circuit board substrate, as is described in Applicant's co-pending U.S. application Ser. No. 09/956,190 entitled LEAD-FRAME METHOD AND ASSEMBLY FOR INTERCONNECTING CIRCUITS WITHIN A CIRCUIT MODULE filed Sep. 19, 2001.

In those memory card configurations which in employ the use of the above-described substrate having one or more electrical devices or components mounted thereto, such components are typically covered or protected by a cap or lid (sometimes referred to as a "skin") which is separately fabricated and attached to the substrate. The cap is typically fabricated through the implementation of an injection molding process, and is subsequently adhesively secured to the substrate in a manner covering or shielding the components mounted thereto. The cap is typically fabricated such that when mounted to the substrate, the resultant memory card meets or achieves a desired "form factor." As will be recognized, the requirement of separately fabricating the cap and thereafter carrying out a separate process or step to mechanically couple the cap to the substrate increases the manufacturing cost for the prior art memory card, in addition to decreasing yield rate. This separate coupling process also increases the susceptibility of the internal components mounted to the substrate of being contaminated with various particles.

In addition to the foregoing, memory cards, such as secure digital cards, are used by advancing the same into a host socket which includes a plurality of connector pins. Many host sockets include a number of connector pins sufficient to accommodate the contacts included in various memory card formats. Though leadframe based memory cards possess certain advantages over circuit board based cards, one of the drawbacks associated with leadframe based memory cards is that portions of the tie bars which are used to connect the contacts and/or die pad(s) of the leadframe to the outer frame thereof are typically exposed in the leading edge and remaining side edges of the memory card. More particularly, exposed within the leading edge are the severed ends of the tie bars created as a result of the cutting or singulation process typically used to separate the outer frame of the leadframe from the remainder thereof subsequent to the formation of the body of the memory card. These exposed portions of the tie bars give rise to a potential to short against the metal features of the host socket, and are thus highly undesirable. Another limitation of the leadframe based memory card is routability. Leadframe based memory cards cannot accommodate complex component interconnections.

The present invention addresses and overcomes the aforementioned deficiencies of currently known memory cards by providing a memory card which includes a land grid array (LGA) structure and is fabricated through the implementation of a two-stage molding process such that the external signal contacts (ESC's) are located on a recessed plane within the memory card, and the exposed tie bars which are typical artifacts of traditional leadframe based memory cards are eliminated. The use of the two-stage molding process in the fabrication of the memory card of the present invention also effectively eliminates the need for the separate cap or lid of prior art memory cards, and provides a molded memory card with the desirable look of a lidded memory card. Further, the land grid array structure in the present memory card provides signal routing capability similar to that of a laminate substrate of a conventional memory card, but provides many of the cost/manufacturing economies of currently known leadframe based memory cards. Thus, the memory card of the present invention possesses the most desirable attributes of both laminate based, lidded memory cards and leadframe based, molded memory cards. These and other features of the present invention will be described in more detail below.

BRIEF SUMMARY OF THE INVENTION

In accordance with the present invention, there is provided a memory card which is fabricated through a process wherein first and second encapsulation parts are separately formed on a land grid array (LGA) structure or substrate, and used as an alternative to a conventional cap or lid. The first and second encapsulation parts are formed via the implementation of a two stage molding process. In one embodiment of the memory card, the first encapsulation part is initially formed to cover a portion of the LGA substrate, which is followed by the formation of a second encapsulation part to cover one or more electrical components mounted and electrically connected to the substrate. As such, the second encapsulation part effectively covers or encapsulates the component(s) of the memory card.

In another embodiment of the memory card, the first encapsulation part is initially formed to cover one or more electrical components mounted and electrically connected to the substrate, which is followed by the formation of a second encapsulation part to cover a portion of the substrate. As such, the first encapsulation part effectively covers or encapsulates the component(s) of the memory card. In the resultant memory card of this particular embodiment, the contacts of the substrate are located in a recessed plane, i.e., offset from a surface of the second encapsulation part which defines the bottom surface of the card.

The elimination of the separate cap or lid as a result of the implementation of the two-stage molding process to fabricate the memory card of either embodiment lowers manufacturing costs while increasing yield rate. Moreover, the memory card of either embodiment is devoid of any exposed metal features other than for the external signal contacts thereof. Further, as indicated above, the land grid array substrate in the memory card of either embodiment provides signal routing capability similar to that of a laminate substrate of a conventional memory card, but provides many of the cost/manufacturing economies of currently known leadframe based memory cards.

Further in accordance with the present invention, there is provided a method for fabricating the land grid array substrate integrated into one embodiment of the memory card. The fabrication methodology for the substrate results in various parts of portions thereof being disposed at different heights or elevations.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein:

FIGS. 1A–1E illustrate an exemplary sequence of steps which may be used to facilitate the fabrication of a land grid array substrate for inclusion into a memory card constructed in accordance with a first embodiment of the present invention;

FIGS. 2A–2E illustrate an exemplary sequence of steps which may be used to facilitate the fabrication of the memory card of the first embodiment including the land grid array substrate manufactured in accordance with the process steps shown in FIGS. 1A–1E; and FIGS. 3A–3F illustrate an exemplary sequence of steps which may be used to facilitate the fabrication of a memory card in accordance with a second embodiment of the present invention;

Common reference numerals are used throughout the drawings and detailed description to indicate like elements.

DETAILED DESCRIPTION OF THE INVENTION

Figure 1D:
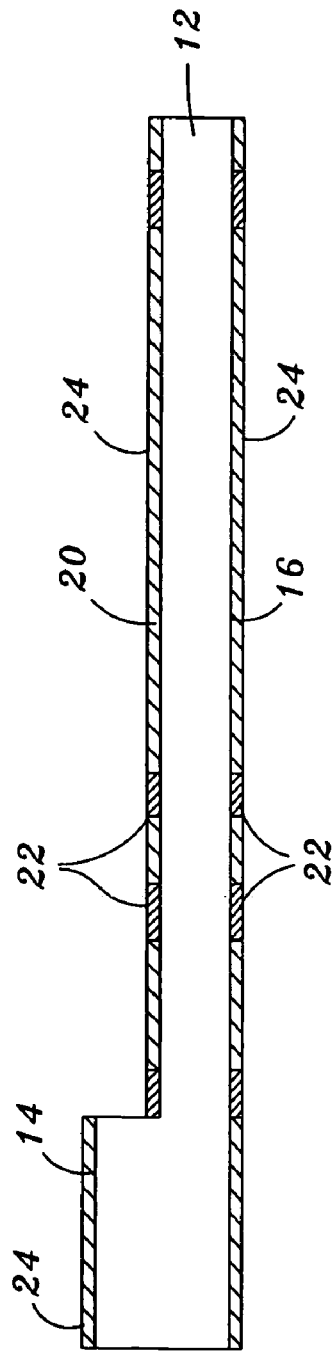

Referring now to the drawings wherein the showings are for purposes of illustrating preferred embodiments of the present invention only, and not for purposes of limiting the same, FIGS. 1A–1E illustrate an exemplary sequence of steps which may be used to facilitate the formation of a land grid array (LGA) structure or substrate 10 which is integrated into a memory card constructed in accordance with a first embodiment of the present invention. As shown in FIG. 1A, in the initial step of the fabrication process for the substrate 10, a layer or sheet 12 of a conductive metal material (e.g., copper) is provided, the sheet 12 defining a generally planar first (top) surface 14 and an opposed, generally planar second (bottom) surface 16. An etch mask 18 is applied to the sheet 12 such that the etch mask 18 covers the entirety of the second surface 16, and a portion of the first surface 14.

Referring now to FIG. 1B, subsequent to the application of the etch mask 18 to the sheet 12, a partial etching or half-etch process is completed wherein a suitable chemical etchant is applied to the exposed portion of the first surface 14 of the sheet 12, i.e., that portion of the first surface 14 not covered by the etch mask 18. The completion of the half-etch process results in the sheet 12 further defining a third surface 20 which is recessed relative to the first surface 14 and disposed in opposed relation to the second surface 16. The partial etching process is completed such that the thickness of the sheet 12 between the second and third surfaces 16, 20 is approximately ½ of the thickness between the first and second surfaces 14, 16.

Referring now to FIG. 1C, upon the completion of the half-etch process, the etch mask 18 is removed from the sheet 12, with a plating mask 22 thereafter being applied to prescribed portions or areas of the second and third surfaces 16, 20 of the sheet 12.

Referring now to FIG. 1D, subsequent to the application of the plating mask 22 to the sheet 12 in the above-described manner, a plating layer 24 is applied to the first surface 14, and to those areas of the second and third surfaces 16, 20 which are not covered by the plating mask 22. Each plating layer 24 is preferably fabricated from a conductive metal material such as silver, nickel, and/or gold (but not necessarily limited to these metals). Upon the complete formation of each plating layer 24, the plating mask 22 is removed from the sheet 12.

Figure 1E:
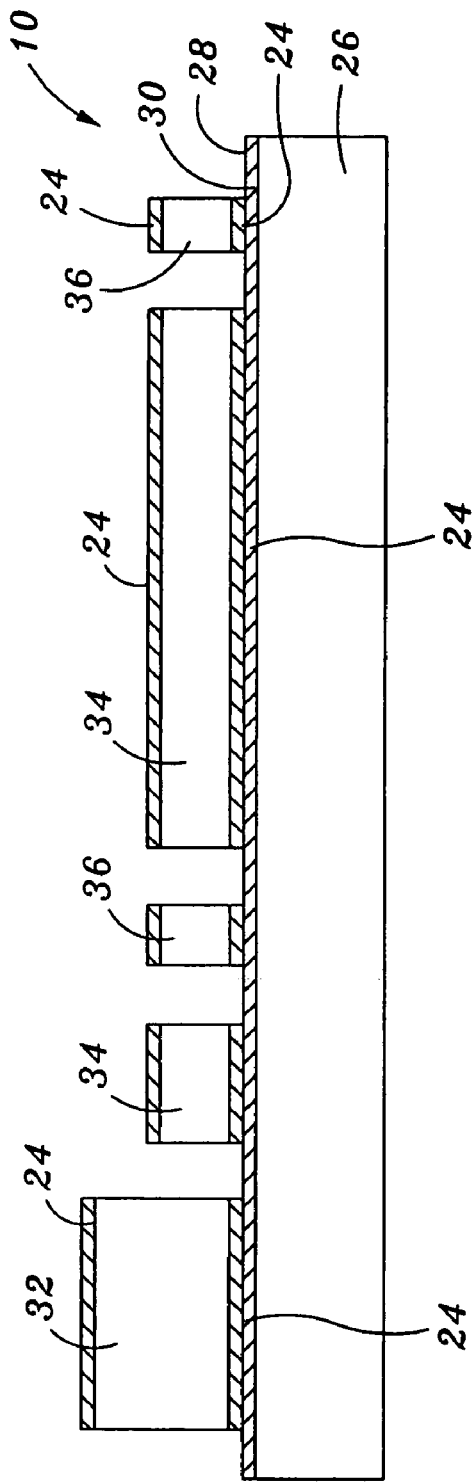

Referring now to FIG. 1E, upon the removal of the plating mask 22 therefrom, the sheet 12 including the plating layers 24 is mounted to a carrier 26 which is typically fabricated from a metal material (e.g., copper). More particularly, the plating layer 24 formed on the second surface 16 of the sheet 12 is adhered to a tape layer 28 which is itself applied to a first surface 30 of the carrier 26. Thereafter, an etching process is completed wherein a chemical etchant is applied to those areas of the third surface 20 of the sheet 12 from which the plating mask 22 was previously removed, i.e., those areas of the third surface 20 not covered by a plating layer 24. This etching process results in the removal of those portions of the sheet 12 which are located between the aligned areas of the second and third surfaces 16, 20 of the sheet 12 exposed as a result of the removal of the plating mask 22. Thus, as seen in FIG. 1E, the sheet 12 is effectively divided or segregated into a number of separate and distinct parts, including a plurality of contacts 32, a pair of die pads 34, and a plurality of conductive traces 36. The contacts 32, die pads 34 and traces 36 collectively define the completed land grid array substrate 10.

In the completed substrate 10, the contacts 32, die pads 34 and traces 36 each include a pair of the plating layers 24 which are disposed on respective ones of opposed sides or faces thereof. Those of ordinary skill in the art will recognize that the configuration of the substrate 10 as shown in FIG. 1E is exemplary only in that the same may include fewer or greater than the two die pads 34 depicted. Further, the particular pattern or arrangement of the conductive traces 36 included in the substrate 10 may be varied from the pattern shown. Advantageously, as indicated above, the above-described process for forming the substrate 10 allows for the formation of the traces 36 in a manner providing signal routing capabilities similar to that of a laminate substrate of a conventional memory card.

Figures 1, 2C:
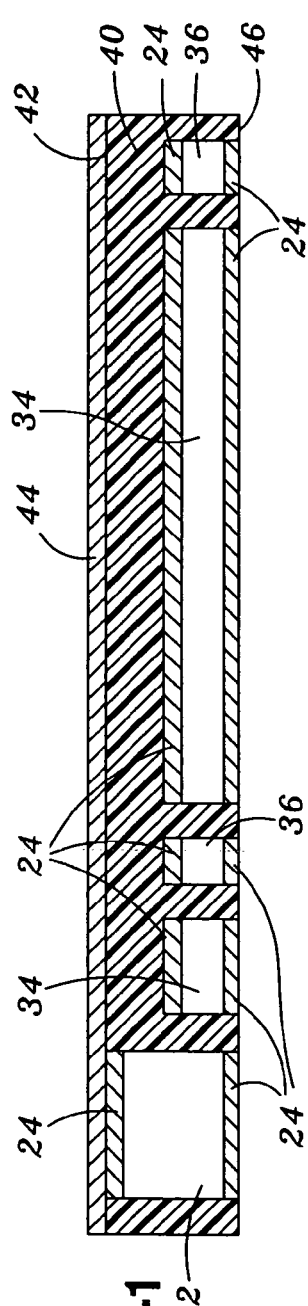
Figure 2D:
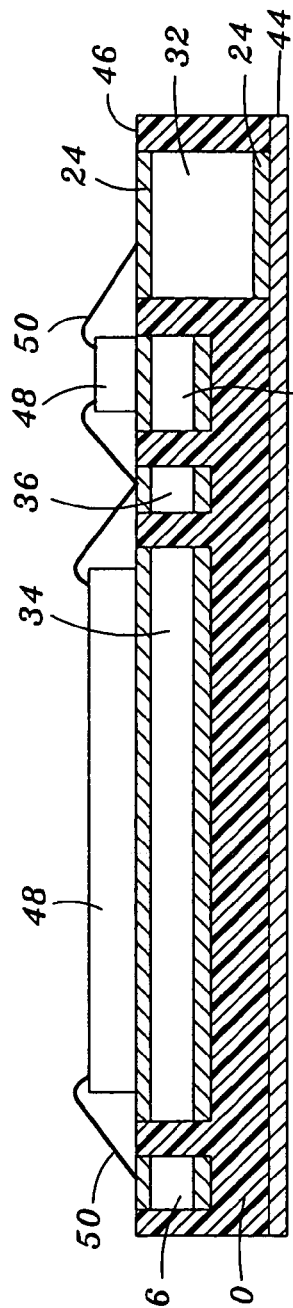
Figure 2E:
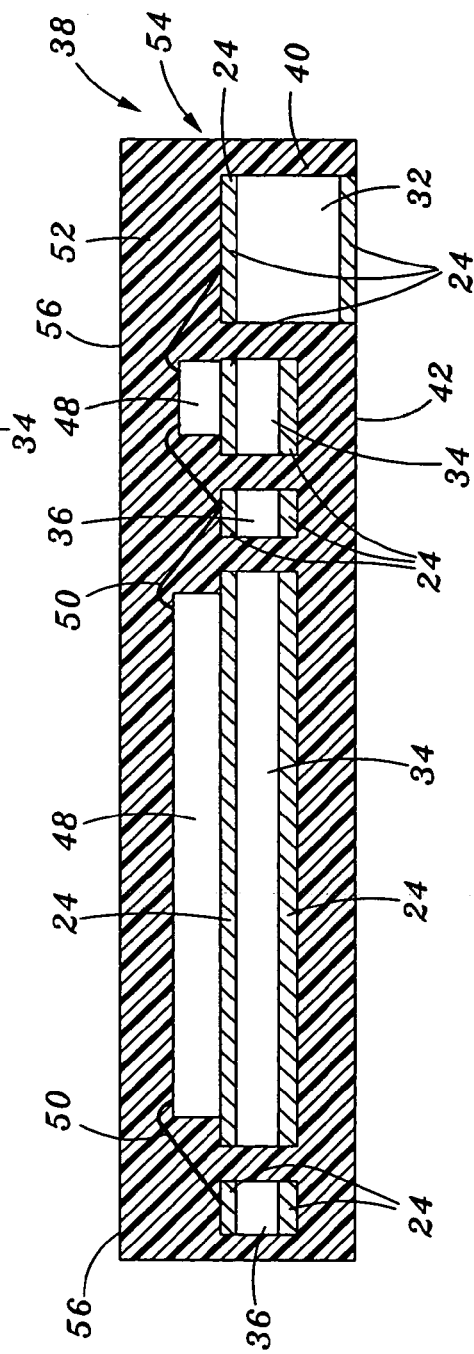

Referring now to FIGS. 2A–2E, there is shown an exemplary sequence of steps for facilitating the fabrication of a memory card 38 which is constructed in accordance with a first embodiment of the present invention and is shown in its fully fabricated state in FIG. 2E. In the initial step of the fabrication process shown in FIG. 2A, a land grid array substrate 10 is formed in accordance with the process flow steps shown and described above in relation to FIGS. 1A–1E. In FIG. 2A, a pair of the substrates 10 is depicted as being disposed upon the tape layer 28 of a common carrier 26. In this regard, those of ordinary skill in the art will recognize that the fabrication process which will be described below, though applicable to fabricating one memory card 38 at a time, is typically implemented on a scale wherein multiple memory cards 38 are simultaneously fabricated, thus compelling the exemplary depiction of a spaced pair of the substrates 10 in FIG. 2A, and in FIGS. 2B and 2C as well.

Referring now to FIG. 2B, after the substrate 10 has been fully formed, a first molding process is completed wherein the substrate 12 is covered or encapsulated with a first encapsulation part 40. The first encapsulation part 40 is preferably fabricated from a suitable plastic material or an epoxy mold compound. As seen in FIG. 2B, the first encapsulation part 40 is formed such that the die pads 34 and traces 36 are completely covered by the first encapsulation part 40, except for those surfaces of the plating layers 24 of the die pads 34 and traces 36 which are in direct contact with the tape layer 28. Similarly, the contacts 32 are covered by the first encapsulation part 40, except for that surface of one plating layer 24 of each contact 32 which is in contact with the tape layer 28, and one surface of the remaining plating layer 24 of each contact 32 which extends in generally flush relation to a generally planar first surface 42 defined by the fully molded first encapsulation part 40. Thus, one generally planar surface of one of the plating layers 24 of each of the contacts 32 is exposed in the first surface 42 of the first encapsulation part 40. Upon the formation of the first encapsulation part 40, a tape laminate 44 is applied thereto in a manner wherein the tape laminate 44 covers the entirety of the first surface 42, including those surfaces of the plating layers 24 of the contacts 32 which are exposed therein.

Referring now to FIG. 2C, subsequent to the application of the tape laminate 44 to the first encapsulation part 40 in the above-described manner, the carrier 26 and tape layer 28 are removed. A single substrate 26 having the first encapsulation part 40 applied thereto and the carrier 26/tape layer 28 removed therefrom is depicted in FIGS. 2C-1. As shown in FIGS. 2C and 2C-1, the removal of the carrier 26/tape layer 28 results in one surface of one plating layer 24 of each of the contacts 32, die pads 34 and traces 36 being exposed in and substantially flush with a generally planar second surface 46 of the first encapsulation part 40 which is disposed in opposed relation to the first surface 42. As will be recognized, in the process flow wherein multiple memory cards 38 are simultaneously fabricated, the tape laminate 44 maintains the individual first encapsulation parts 40 and corresponding substrates 10 in prescribed spatial relationships relative to each other.

Referring now to FIG. 2D, Upon the removal of the carrier 26/tape layer 28, the first encapsulation part 40 and corresponding substrate 10 are inverted, with various electronic components 48 being mounted to the exposed surfaces of the plating layers 24 of each of the die pads 34. The electronic components 48 may comprise semiconductor packages, semiconductor dies, passive components or other devices, and may be provided in any combination. Though, in FIG. 2D, one electronic component 48 is shown as being attached to the exposed plating layer 24 of each die pad 34, those of ordinary skill in the art will recognize that multiple electronic components 48 may be attached to such plating layer 24 of one or both of the die pads 34. In this regard, the number and arrangement of electronic components 48 depicted in FIG. 2D is intended to be exemplary only. After the electronic components 48 have been attached to the exposed surfaces of the plating layers 24 of the die pads 34, conductive wires 50 are used to electrically connect the electronic components 48 to one or more of the contacts 32 and/or one or more of the traces 36. As shown in FIGS. 2D and 2E, a conductive wire 50 may be extended between a pad or terminal of an electronic component 48 and the exposed surface of the plating layer 24 of one of the traces 36 or one of the contacts 32. In this regard, the conductive wires 50 may be used to achieve any desired pattern of electrical communication between the electronic components 48, the traces 36 and the contacts 32. Though not shown, those of ordinary skill in the art will recognize that a flip chip attachment technique may be used as an alternative the above-described wire bonding technique, as may a combination of flip chip and wire bonding techniques.

Referring now to FIG. 2E, upon the completion of the wire bonding process described above in relation to FIG. 2D, a second molding process is completed wherein a second encapsulation part 52 is formed upon the second surface 46 of the first encapsulation part 40. In this regard, the second encapsulation part 52 effectively covers the electronic components 48 and the conductive wires 50. The second encapsulation part 52 also covers those surfaces of the plating layers 24 of the contacts 32, die pads 34 and traces 36 originally exposed in the second surface 46 of the first encapsulation part 40. The first and second encapsulation parts 40, 52 collectively define a body 54 of the memory card 38. Such body 54 includes a generally planar top surface which is defined by a first surface 56 the second encapsulation part 52. A generally planar bottom surface of the body 54 is defined by the first surface 42 of the first encapsulation part 40. Thus, as will be recognized, those surfaces of the plating layers 24 of the contacts 32 exposed in and substantially flush with the first surface 42 of the first encapsulation part 40 are exposed in the bottom surface of the completed body 54. As a result of the half-etch process employed during the manufacture of the substrate 10, those plating layers 24 of the die pads 34 and traces 36 not having an electronic component 48 mounted thereto or a conductive wire 50 extended thereto are still completely covered by and thus embedded within the body 54. The body 54 also includes multiple, generally planar side surfaces which are defined as a result of generally planar side surfaces of the second encapsulation part 52 being aligned and substantially flush with corresponding generally planar side surfaces of the first encapsulation part 40 upon the completion of the two stage molding process. Subsequent to the formation of the second encapsulation part 52 and hence the body 54, the tape laminate 44 is removed, thus facilitating the complete formation of the memory card 38. As will be recognized, in a process wherein multiple memory cards 38 are simultaneously fabricated, the removal of the tape laminate 44 is equivalent to a singulation process wherein the fully formed memory cards 38 are effectively separated from each other. Upon the removal of the tape laminate 44, each individual memory card 38 may be subjected to a suitable testing process. Though it is contemplated that the memory card 38 will have the format of a secure digital card, those of ordinary skill in the art will recognize that the process steps described above may be employed to facilitate the fabrication of memory cards in alternative formats (e.g., multi-media cards).

Figures 3D, 3E, 3F:
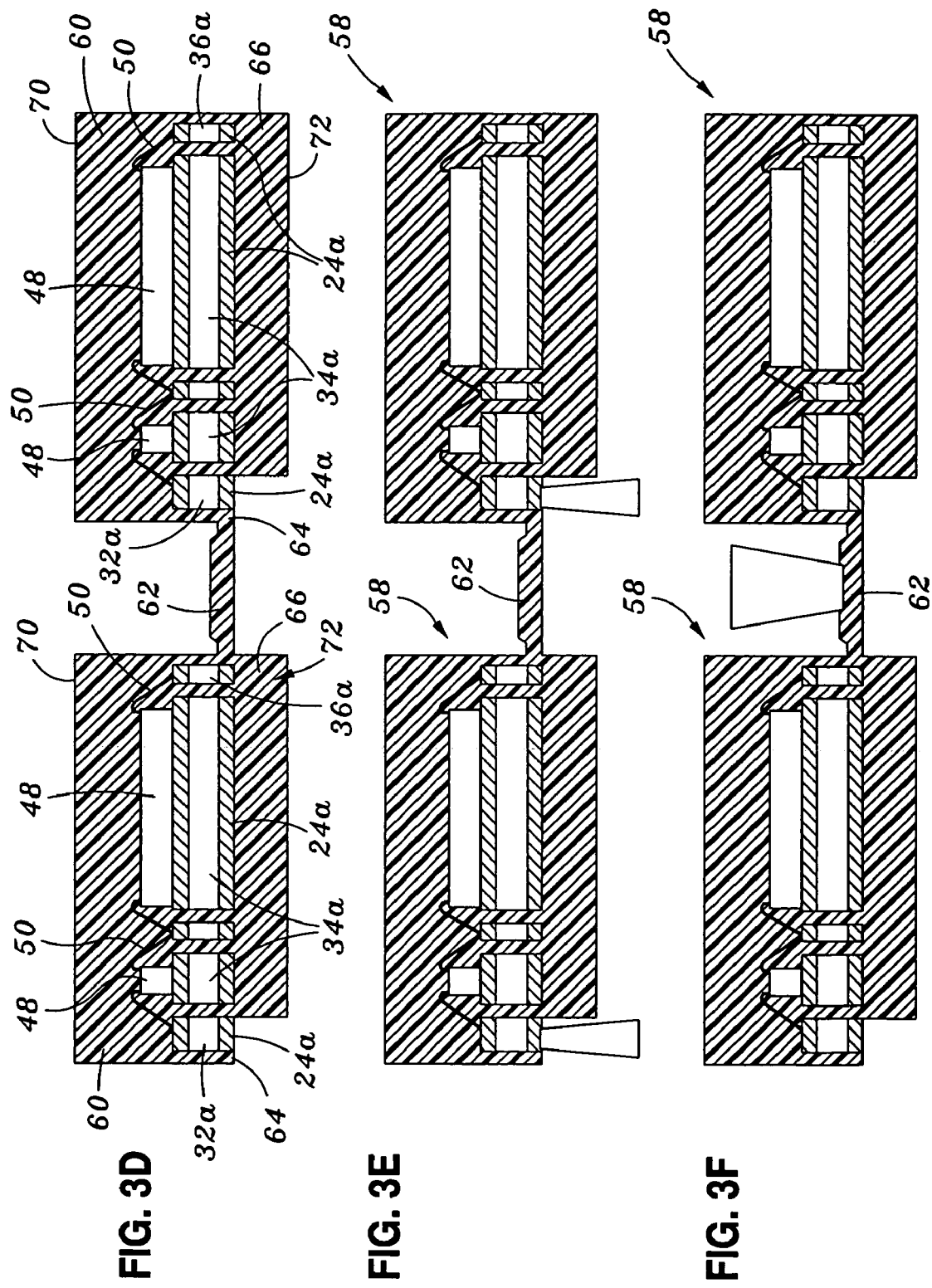
Figures 1, 3D:
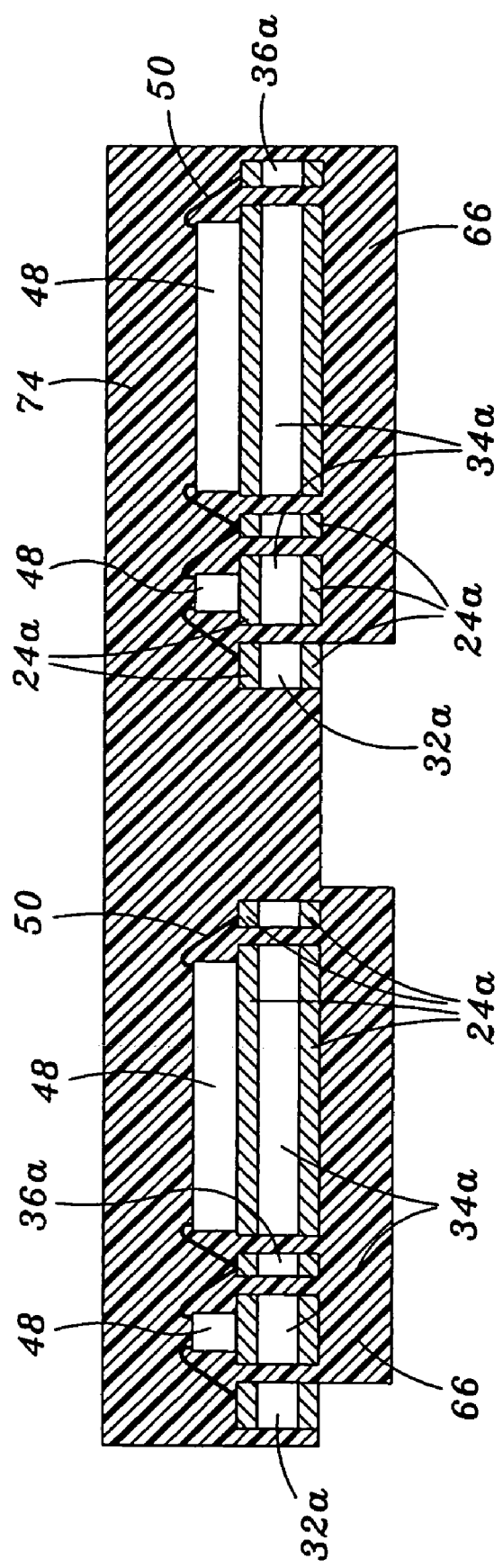

Referring now to FIGS. 3A–3F, there is shown an exemplary sequence of steps which may be used to facilitate the fabrication of a memory card 58 which is constructed in accordance with a second embodiment of the present invention and is shown in its fully fabricated state in FIGS. 3D–3F. In the initial step of the fabrication process shown in FIG. 3A, a land grid array substrate 10a is formed in accordance with process flow steps similar to those shown and described above in relation to FIGS. 1A–1E for the substrate 10. In this regard, the process flow steps for facilitating the fabrication of the substrate 10a differ from those related to the fabrication of the substrate 10 due to the omission of the etch mask 18 placement step shown and described in relation to FIG. 1A and the half-etch process shown and described in relation to FIG. 1B. Thus, the substrate 10a of the memory card 58 bears substantial structural similarity to the substrate 10, with the exception that the contacts 32a, die pads 34a and traces 36a of the substrate 10a are of uniform height or thickness. This is in contrast to the substrate 10 wherein the thickness of the contacts 32 exceeds that of the die pads 34 and traces 36 as a result of the implementation of the aforementioned half-etch process. In FIGS. 3A–3C, a pair of substrates 10a is depicted as being disposed upon the tape layer 28 of a common carrier 26. Those of ordinary skill in the art will recognize that the fabrication process which will be described below, though applicable to fabricating one memory card 58 at a time, is typically implemented on a scale wherein multiple memory cards 58 are simultaneously fabricated, thus compelling the exemplary depiction of a spaced pair of substrates 10a in FIGS. 3A–3C, and in FIGS. 3D–3F as well.

Referring now to FIG. 3B, after the substrate 10a has been fully formed, various electronic components 48 are mounted to those plating layers 24a of each of the die pads 34a which are opposite those plating layers 24a of the die pads 34a adhered to the tape layer 28 of the carrier 26. As described above in relation to the memory card 38 of the first embodiment, the electronic components 48 may comprise semiconductor packages, semiconductor dies, passive components or other devices, and may be provided in any combination. Though, in FIG. 3B, one electronic component 48 is shown as being attached to the exposed, upper most plating layer 24a of each die pad 34a, those of ordinary skill in the art will recognize that multiple electronic components 48 may be attached to such plating layer 24a of one or both of the die pads 34a. In this regard, the number and arrangement of electronic components 48 depicted in FIG. 3B is intended to be exemplary only. After the electronic components 48 have been attached to the exposed, upper most plating layers 24a of the die pads 34a, conductive wires 50 are used to electrically connect the electronic components 48 to one or more of the contacts 32a and/or one or more of the traces 36a. As described above in relation to the memory card 38, the conductive wires 50 may be used to achieve any desired pattern of electrical communication between the electronic components 48, the traces 36a and the contacts 32a. Though not shown, those of ordinary skill in the art will recognize that a flip chip attachment technique may be used as an alternative the above-described wire bonding technique, as may a combination of flip chip and wire bonding techniques.

Referring now to FIG. 3C, upon the completion of the wire bonding process described above in relation to FIG. 3B, a first molding process is completed wherein the substrate 10a, the electronic components 48 mounted thereto, and the corresponding conductive wires 50 are covered or encapsulated with a first encapsulation part 60. The first encapsulation part 60 is preferably fabricated from a suitable plastic material or an epoxy mold compound. As seen in FIG. 3C, the first encapsulation part 60 is formed such that the substrate 10a is completely covered thereby, except for those surfaces of the plating layers 24a of the contacts 32a, die pads 34a and traces 36a which are in direct contact with the tape layer 28 applied to the carrier 12.

As further shown in FIG. 3C, adjacent first encapsulation parts 60 formed on the tape layer 28 may optionally be interconnected to each other through an integral web 62 formed during the molding process. Immediately subsequent to the formation of the first encapsulation part 60, the carrier 26 and tape layer 28 are removed. As a result of such removal, one generally planar surface of one of the plating layers 24a of each of the contacts 32a, die pads 34a and traces 36a is exposed in and substantially flush with a generally planar first surface 64 defined by the first encapsulation part 60.

Referring now to FIG. 3D, subsequent to the formation of the first encapsulation part 60 and removal of the carrier 12/tape layer 28, a second molding process is completed wherein a second encapsulation part 66 is formed upon a portion of the first surface 64 of the first encapsulation part 60. In this regard, the second encapsulation part 66 effectively covers those surfaces of the plating layers 24a of the die pads 34a and traces 36a originally exposed in the first surface 64 of the first encapsulation part 60. However, the surfaces of the plating layers 24a of the contacts 32a originally exposed in the first surface 64 of the first encapsulation part 60 are not covered by the second encapsulation part 66, and thus remain exposed in a body 68 of the memory card 58 which is collectively defined by the first and second encapsulation parts 60, 66. Such body 68 includes a generally planar top surface which is defined by a second surface 70 of the first encapsulation part 60 disposed in opposed relation to the first surface 64 thereof. A generally planar bottom surface of the body 68 is defined by a first surface 72 of the second encapsulation part 66. Due to the manner in which the second encapsulation part 66 is preferably formed, that portion of the first surface 64 of the first encapsulation part 60 which is not covered by the second encapsulation part 66 is recessed relative to the first surface 72 of the second encapsulation part 66. Thus, the exposed surfaces of the plating layers 24a of the contacts 32a are likewise recessed, and thus located on a recessed plane within the memory card 58.

Referring now to FIG. 3E, subsequent to the formation of the second encapsulation part 66 in the above-described manner, the memory card 58 may be subjected to a suitable testing process. Thereafter, as shown in FIG. 3F, a punch singulation process may be implemented to remove the web 62 (if included) interconnecting the first encapsulation parts 60 of the bodies 68 of the memory cards 58 to each other. As shown in FIGS. 3D-1, it is further contemplated that as an alternative to the formation of separate first encapsulation parts 60 on the tape layer 28 (whether or not interconnected by the integral web(s) 62), the simultaneous fabrication of multiple memory cards 58 may be facilitated by forming a single mold cap 74 which covers the adjacent substrates 10a and the electronic components 48 and wires 50 interfaced thereto. Subsequent to the formation of the individual second encapsulation parts 66 in the above-described manner and testing of the memory cards 58, such mold cap 74 would be subjected to a saw (or equivalent laser or waterjet) singulation process to effectively separate the same into the structural equivalents of the first encapsulation parts 60.

Advantageously, the memory cards 38, 58 constructed in accordance with the above-described embodiments of the present invention each possess the most desirable attributes of both laminate based, lidded memory cards and leadframe based, molded memory cards. In this regard, neither memory card 38, 58 includes any exposed tie bars which are typical artifacts of traditional leadframe based memory cards. The use of a two-stage molding process in the fabrication of the memory cards 38, 58 also effectively eliminates the need for the separate cap or lid of prior art memory cards, and provides each memory card 38, 58 with the desirable look of a lidded memory card. Further, the land grid array substrate 10, 10a of the memory cards 38, 58, due to its manner of fabrication, provides signal routing capabilities similar to that of the laminate substrate of a conventional memory card, while still providing various cost and manufacturing economies.

Figure 4A:
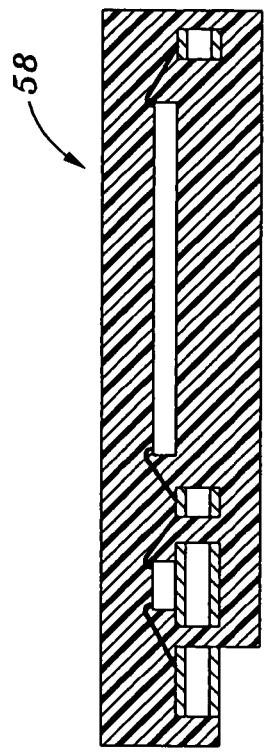
FIGS. 4A and 4B are cross-sectional views of variations of the memory card constructed in accordance with the first embodiment of the present invention.
Figure 4B:
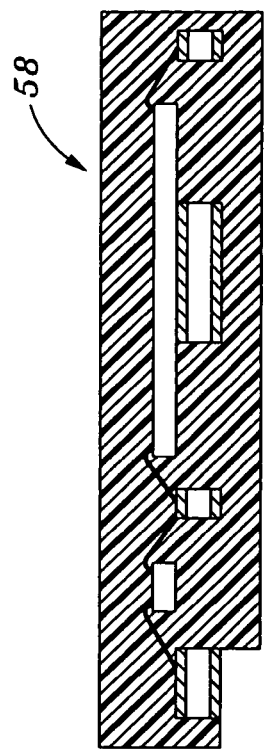
Figure 5A:
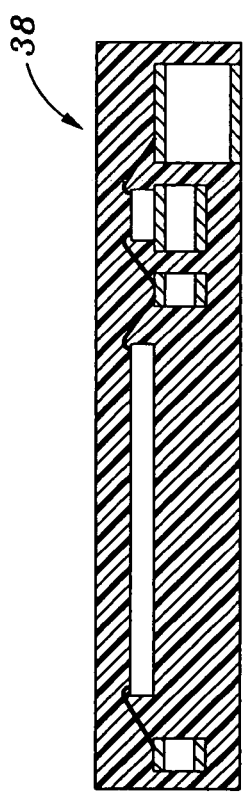
FIGS. 5A and 5B are cross-sectional views of variations of the memory card constructed in accordance with the second embodiment of the present invention.
Figure 5B:
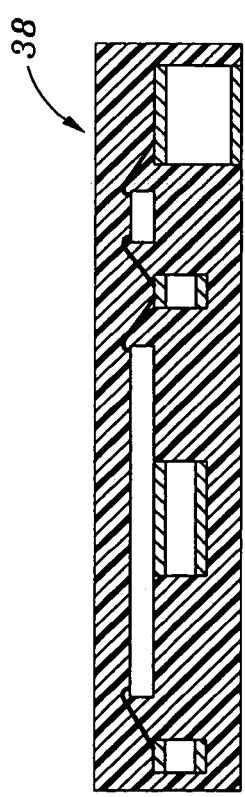

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure. For example, the memory card 38 of the first embodiment may alternatively be configured such that one or both of the die pads 34 are eliminated (FIG. 4A) or of reduced size such that the corresponding electronic component 48 is only partially disposed thereon (FIG. 4B). Similarly, the memory card 58 of the second embodiment may alternatively be configured such that one or both of the die pads 34a are eliminated (FIG. 5A) or of reduced size such that the corresponding electronic component 48 is only partially disposed thereon (FIG. 5B).

What is claimed is:

1. A memory card, comprising:
   a substrate having a plurality of contacts, at least one die pad, and a plurality of traces, the contacts, the die pad and the traces being disposed in spaced relation to each other and each defining opposed first and second surfaces, the first surfaces of the contacts, the die pad, and the traces extending in generally coplanar relation to each other, with the second surfaces of the die pad and the traces extending along a first plane, and the second surfaces of the contacts extending along a second plane which is spaced from and generally parallel to the first plane;
   at least one electronic component mounted to the first surface of the die pad and electrically connected to at least one of the contacts;
   a first encapsulation part covering the second surfaces of the die pad and the traces, the second surfaces of the contacts being exposed in the first encapsulation part; and
   a second encapsulation part covering the electronic component and the first surfaces of the die pad, the contacts, and the traces;
   the first and second encapsulation parts collectively defining a body of the memory card which includes a bottom surface having the second surfaces of the contacts exposed therein.

2. The memory card of claim 1 wherein:
   the substrate has at least two die pads which each include at least one electronic component mounted to the first surface thereof; and
   each of the electronic components is electrically connected to at least one of the contacts either directly or via at least one of the traces.

3. The memory card of claim 2 wherein the electronic components are selected from the group consisting of:
   a semiconductor package;
   a semiconductor die;
   a passive component; and
   combinations thereof.

4. The memory card of claim 1 wherein the electronic component is electrically connected to at least one of the contacts by a conductive wire which is covered by the second encapsulation part.

5. The memory card of claim 1 wherein:
   the first encapsulation part defines multiple side surfaces; and
   the second encapsulation part defines multiple side surfaces which are substantially continuous with respective ones of the side surfaces of the first encapsulation part.

6. The memory card of claim 1 wherein the first encapsulation part and the second encapsulation part are each fabricated from an epoxy mold compound.

7. The memory card of claim 1 wherein the memory card is a secure digital card.

8. A memory card, comprising:
   a substrate having a plurality of contacts, at least one die pad, and a plurality of traces, the contacts, the die pad and the traces being disposed in spaced relation to each other and each defining opposed first and second surfaces;
   at least one electronic component mounted to the first surface of the die pad and electrically connected to at least one of the contacts;
   a first encapsulation part covering the second surfaces of the die pad and the traces, the second surfaces of the contacts being exposed in the first encapsulation part; and
   a second encapsulation part covering the electronic component and the first surfaces of the die pad, the contacts, and the traces;
   the first and second encapsulation parts collectively defining a body of the memory card which includes a bottom surface having the second surfaces of the contacts exposed therein;
   wherein the first and second surfaces of the contacts, the die pad and the traces each include a plating layer disposed thereon, the plating layer disposed on the second surface of each of the contacts being exposed in the bottom surface of the body.

9. A memory card, comprising:
   a substrate having a plurality of contacts, at least one die pad, and a plurality of traces, the contacts, the die pad and the traces being disposed in spaced relation to each other and each defining opposed first and second surfaces;
   at least one electronic component mounted to the first surface of the die pad and electrically connected to at least one of the contacts;

a first encapsulation part covering the electronic component and the first surfaces of the die pad, the contacts, and the traces; and a second encapsulation part covering the second surfaces of the die pad and the traces, the second surfaces of the contacts being exposed in the first encapsulation part and not covered by the second encapsulation part;

the first and second encapsulation parts collectively defining a body of the memory card.

10. The memory card of claim 9 wherein the first and second surfaces of the contacts, the die pad and the traces each include a plating layer disposed thereon, the plating layer disposed on the second surface of each of the contacts being exposed in the body.

11. The memory card of claim 9 wherein:

the substrate has at least two die pads which each include at least one electronic component mounted to the first surface thereof; and each of the electronic components is electrically connected to at least one of the contacts either directly or via at least one of the traces.

12. The memory card of claim 11 wherein the electronic components are selected from the group consisting of:

a semiconductor package;

a semiconductor die;

a passive component; and combinations thereof.

13. The memory card of claim 9 wherein the electronic component is electrically connected to at least one of the contacts by a conductive wire which is covered by the first encapsulation part.

14. The memory card of claim 9 wherein:

the first encapsulation part defines multiple side surfaces; and the second encapsulation part defines multiple side surfaces, at least some of the side surfaces of the second encapsulation part being substantially continuous with respective ones of the side surfaces of the first encapsulation part.

15. The memory card of claim 9 wherein the first encapsulation part and the second encapsulation part are each fabricated from an epoxy mold compound.

16. The memory card of claim 9 wherein the first surfaces of the contacts, the die pad, and the traces extend in generally coplanar relation to each other.

17. The memory card of claim 16 wherein the second surfaces of the contacts, the die pad, and the traces extend in generally coplanar relation to each other.

18. The memory card of claim 9 wherein the memory card is a secure digital card.

19. A memory card, comprising:

a substrate having a plurality of contacts, at least one die pad, and a plurality of traces, the contacts, the die pad and the traces being disposed in spaced relation to each other and each defining opposed first and second surfaces, the second surfaces of the die pad and the traces extending along a first plane, and the second surfaces of the contacts extending along a second plane which is spaced from and generally parallel to the first plane;

at least one electronic component mounted to the first surface of the die pad and electrically connected to at least one of the contacts;

a first encapsulation part covering the second surfaces of the die pad and the traces, the second surfaces of the contacts being exposed in the first encapsulation part; and a second encapsulation part covering the electronic component and the first surfaces of the die pad, the contacts, and the traces;

the first and second encapsulation parts collectively defining a body of the memory card which includes a bottom surface having the second surfaces of the contacts exposed therein.

20. The memory card of claim 19 wherein:

the first encapsulation part defines multiple side surfaces; and the second encapsulation part defines multiple side surfaces which are substantially continuous with respective ones of the side surface of the first encapsulation part.

* * * * *